US012664456B2

(12) United States Patent
Gross et al.

(10) Patent No.: US 12,664,456 B2
(45) Date of Patent: Jun. 23, 2026

(54) CHARACTERIZATION OF QUANTUM LOGIC GATES VIA DYNAMICAL DECOUPLING

(71) Applicant: Google LLC, Mountain View, CA (US)

(72) Inventors: Jonathan Arthur Gross, Venice, CA (US); Dripto Mazumdar Debroy, Los Angeles, CA (US); Ze-Pei Cian, Mountain View, CA (US); Matthew Gary Neeley, Goleta, CA (US); Zhang Jiang, El Segundo, CA (US)

(73) Assignee: GOOGLE LLC, Mountain View, CA (US)

( * ) Notice: Subject to any disclaimer, the term of this patent is extended or adjusted under 35 U.S.C. 154(b) by 68 days.

(21) Appl. No.: 18/401,235

(22) Filed: Dec. 29, 2023

(65) Prior Publication Data

US 2025/0181951 A1    Jun. 5, 2025

Related U.S. Application Data

(60) Provisional application No. 63/436,320, filed on Dec. 30, 2022.

(51) Int. Cl.
*G06N 10/40* (2022.01)
*G06N 10/60* (2022.01)
*H03K 19/195* (2006.01)

(52) U.S. Cl.
CPC ............. *G06N 10/40* (2022.01); *G06N 10/60* (2022.01); *H03K 19/195* (2013.01)

(58) Field of Classification Search
CPC ....... G06N 10/40; G06N 10/60; H03K 19/195
USPC ............................................ 326/7, 1; 708/30
See application file for complete search history.

(56) References Cited

U.S. PATENT DOCUMENTS

2024/0388297 A1* 11/2024 Debroy .................. G06N 10/20

OTHER PUBLICATIONS

Arute et al., "Quantum Supremacy Using a Programmable Superconducting Processor", Nature, vol. 574, No. 505, Oct. 24, 2019, pp. 505-511.
Berry et al., "Optimal States and Almost Optimal Adaptive Measurements for Quantum Interferometry", American Physical Society, vol. 85, No. 24, Dec. 11, 2000, pp. 5098-5101.
(Continued)

*Primary Examiner* — Arnold M Kinkead
(74) *Attorney, Agent, or Firm* — DORITY & MANNING P.A.

(57) ABSTRACT
One example aspect of the present disclosure is directed to a method for characterizing a multi-qubit logic gate operating on a pair of qubits. The method includes iteratively performing, via a multi-qubit quantum circuit, a set of serial operations on the pair of qubits. The multi-qubit quantum circuit includes the multi-qubit logic gate, a first single-qubit logic gate operating on the first qubit, and a second single-qubit logic gate operating on the second qubit. After iteratively performing the set of serial operations on the pair of qubits, a first quantum state of the first qubit and a second quantum state of the second qubit are measured. A first set of expectation values for the first qubit and a second set of expectation values for the second qubit are determined. A value for a first parameter of a set of parameters of the multi-qubit logic gate is determined.

18 Claims, 7 Drawing Sheets

(56)          References Cited

OTHER PUBLICATIONS

Blume-Kohout et al., "Demonstration of Qubit Operations Below a Rigorous Fault Tolerance Threshold with Gate Set Tomography", Nature Publishing Group, vol. 8, No. 1, 2017, pp. 1-13.

Boxio et al., "Parameter Estimation with Mixed-State Quantum Computation", arXiv:0708.1330v2[quant-ph], Apr. 15, 2008, 12 pages.

Braunstein et al., "Generalized Uncertainty Relations: Theory, Examples, and Lorentz Invariance", arXiv: quant-ph/9507004v1, Jul. 7, 1995, 40 pages.

Burgh et al., "Quantum Methods for Clock Synchronization: Beating the Standard Quantum Limit Without Entanglement", American Physical Society, vol. 72, 2005, pp. 0423011-0423019.

Burnett et al., "Decoherence Benchmarking of Superconducting Qubits", NPJ Quantum Information, vol. 5, No. 54, 2019, pp. 1-8.

Bylander et al., "Noise Spectroscopy Through Dynamical Decoupling with a Superconducting Flux Qubit", Nature Physics, vol. 7, 2011, pp. 565-570.

Caves, "Quantum-Mechanical Noise in an Interferometer", American Physical Society, vol. 23, No. 8, Apr. 15, 1981, pp. 1693-1708.

Chan et al., "Assessment of a Silicon Quantum Dot Spin Qubit Environment via Noise Spectroscopy", vol. 10, 2018, pp. 0440171-0440177.

Cleve et al., "Quantum Algorithms Revisited", Royal Society of London, vol. 454, No. 1969, 1998, pp. 339-354.

Erhard et al., "Characterizing Large-Scale Quantum Computers via Cycle Benchmarking", Nature Communications, vol. 10, No. 1, 2019, pp. 1-7.

Fogarty et al., "Non-exponential Fidelity Decay in Randomized Benchmarking with Low-Frequency Noise", American Physical Society, vol. 92, 2015, pp. 1-7.

Giovannetti et al., "Advances in Quantum Metrology", Nature Photonics, vol. 5, 2011, pp. 1-10.

Giovannetti et al., "Quantum Metrology", American Physical Society, vol. 96, No. 1, 2006, pp. 1-4.

Greenbaum, "Introduction to Quantum Gate Set Tomography", arXiv:1509.02921v1, Sep. 9, 2015, 57 pages.

Hall, "Random Quantum Correlations and Density Operator Distributions", arXiv: quant-ph/9802052v2, Jul. 24, 1998, 13 pages.

Higgins et al., "Demonstrating Heisenberg-limited Unambiguous Phase Estimation Without Adaptive Measurements", New Journal of Physics, vol. 11, 2009, pp. 1-14.

Higgins et al., "Entanglement-free Heisenberg-limited Phase Estimation", Nature Publishing Group, vol. 450, Nov. 15, 2007, pp. 393-396.

Holland et al., "Interferometric Detection of Optical Phase Shifts at the Heisenberg Limit", Physical Review Letters, vol. 71, No. 9, Aug. 30, 1993, 4 pages.

Kelly et al., "Physical Qubit Calibration on a Directed Acyclic Graph", arXiv:1803.03226v1, Mar. 8, 2018, 7 pages.

Kimmel et al., "Robust Calibration of a Universal Single-Qubit Gate-Set via Robust Phase Estimation", arXiv:1502.02677v3[quant-ph], Oct. 21, 2021, 15 pages.

Kitaev, "Quantum Measurements and the Abelian Stabilizer Problem", arXiv: quant-ph/9511026v1, Nov. 20, 1995, 22 pages.

Klimov et al., "Fluctuations of Energy-Relaxation Times in Superconducting Qubits", American Physical Society, vol. 121, 2018, pp. 0905021-0905025.

Knill et al., "Randomized Benchmarking of Quantum Gates", arXiv:0707.0963v1, Jul. 6, 2007, 13 pages.

Lee et al., "A Quantum Rosetta Stone for Interferometry", Journal of Modern Optics, vol. 49, 2002, pp. 1-8.

Luis et al., "Optimum Phase-Shift Estimation and the Quantum Description of the Phase Difference", American Physical Society, vol. 54, No. 5, Nov. 1996, pp. 4564-4570.

Magesan et al., "Compressing Measurements in Quantum Dynamic Parameter Estimation", American Physical Society, vol. 88, No. 6, 2013, 0621091-06210913.

Magesan et al., "Robust Randomized Benchmarking of Quantum Processes", arXiv:1009.3639v1, Sep. 19, 2010, 5 pages.

Megrant et al., "Planar Superconducting Resonators with Internal Quality Factors Above One Million", Applied Physics Letters, vol. 11, No. 11, 2012, pp. 1135101-1135104.

Nielsen et al., Quantum Computation and Quantum Information, Cambridge, Cambridge University, Oct. 2000, 710 pages.

Proctor et al., "Detecting, Tracking, and Eliminating Drift in Quantum Information Processors", arXiv:1907.13608v1, Jul. 31, 2019, 19 pages.

Rudinger et al., "Experimental Demonstration of a Cheap and Accurate Phase Estimation", arXiv:1702.01763v1 [quant-ph], Feb. 6, 2017, 9 pages.

Shabani et. al, "Efficient Measurement of Quantum Dynamics via Compressive Sensing", American Physical Society, vol. 106, 2011, pp. 1004011-1004014.

Summy et al., "Phase Optimized Quantum States of Light", Optics Communications, vol. 77, Issue 1, Jun. 1, 1990, pp. 75-79.

Wan et al., "Quantum Gate Teleportation Between Separated Qubits in a Trapped-Ion Processor", American Association for the Advancement of Science, vol. 364, May 31, 2019, pp. 875-878.

Wiseman et al., "Adaptive Single-Shot Phase Measurements: The Full Quantum Theory", arXiv: quant-ph/9710056v1, Oct. 24, 1997, 25 pages.

Yurke et al., "SU (2) and SU (1,1) Interferometers", American Physical Society, vol. 33, No. 6, Jun. 1986, pp. 4033-4054.

Google AI Quantum and Collaborators, "Supplementary Information for 'Quantum Supremacy Using a Programmable Superconducting Processor'", arXiv:1910.11333v2, Dec. 28, 2019, 67 pages.

International Preliminary Report on Patentability for Application No. PCT/US2023/086528, mailed Jul. 10, 2025, 10 pages.

* cited by examiner

500

502
Iteratively Performing Set of Serial Operations, by Multi-Qubit Quantum Circuit Included in Quantum Computing System, on Pair of Qubits, wherein Multi-Qubit Quantum Circuit Includes at least Multi-Qubit Logic Gate, First Single-Qubit Logic Gate Enabled to Operate on First Qubit, and Second Single-Qubit Logic Gate Enabled to Operate on Second Qubit, and wherein Set of Serial Operations Includes First Operation Comprising Multi-Qubit Logic Gate Operating on Pair of Qubits and Second Operation Comprising First Single-Qubit Logic Gate Operating on First Qubit in Parallel to Second Single-Qubit Logic Gate Operating on Second Qubit 504
After Iteratively Performing Set of Serial Operations on Pair of Qubits, Measuring, at Quantum Computing System, First Quantum State of First Qubit 506
After Iteratively Performing Set of Serial Operations on Pair of Qubits, Measuring, at Quantum Computing System, Second Quantum State of Second Qubit 508
Determining, at Quantum Computing System, First Set of Expectation Values for First Qubit based on First Quantum State of First Qubit 510
Determining, at Quantum Computing System, Second Set of Expectation Values for Second Qubit based on Second Quantum State of Second Qubit 512
Determining, at Quantum Computing System, Value for at least First Parameter of Set of Parameters of Multi-Qubit Logic Gate based on the First Set of Expectation Values for First Qubit and Second Set of Expectation Values for Second Qubit

FIG. 5

CHARACTERIZATION OF QUANTUM LOGIC GATES VIA DYNAMICAL DECOUPLING

PRIORITY CLAIM

The present application claims priority to U.S. Provisional Application No. 63/436,320, entitled "CHARACTERIZATION OF QUANTUM LOGIC GATES VIA DYNAMICAL DECOUPLING," filed on Dec. 30, 2023, the contents of which are herein incorporated in their entirety.

FIELD

The present disclosure relates generally to quantum computing systems, and more particularly to calibrating composite quantum gates (e.g., two-qubit quantum gates) in quantum computing systems.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a $|0\rangle + b|1\rangle$ The "0" and "1" states of a digital computer are analogous to the $|0\rangle$ and $|1\rangle$ basis states, respectively of a qubit.

SUMMARY

Aspects and advantages of embodiments of the present disclosure will be set forth in part in the following description, or can be learned from the description, or can be learned through practice of the embodiments.

One example aspect of the present disclosure is directed to a method for characterizing a multi-qubit logic gate, e.g., a Fermionic Simulation (fSim) gate. The multi-qubit logic gate is enabled to operate on a pair of qubits. The pair of qubits includes a first qubit and a second qubit. The method includes iteratively performing a set of serial operations on the pair of qubits. The set of serial operations may be performed by a multi-qubit quantum circuit. The multi-qubit quantum circuit may be included in a quantum computing system. The multi-qubit quantum circuit includes at least the multi-qubit logic gate, a first single-qubit logic gate (e.g., a first Pauli gate) enabled to operate on the first qubit, and a second single-qubit logic gate (e.g., a second Pauli gate) that is enabled to operate on the second qubit. The set of serial operations includes at least a first operation and a second operation. The first operation includes the multi-qubit logic gate operating on the pair of qubits. The second operation includes the first single-qubit logic gate operating on the first qubit. The second operation also includes the second single-qubit logic gate operating on the second qubit. The first single-qubit logic operating on the first qubit and the second single-qubit logic gate operating on the second qubit may be performed in parallel. After iteratively performing the set of serial operations on the pair of qubits, a first quantum state of the first qubit may be measured at the quantum computing system. After iteratively performing the set of serial operations on the pair of qubits, a second quantum state of the second qubit may be measured at the quantum computing system. A first set of expectation values for the first qubit may be determined at the quantum computing system. Determining the first set of expectation values for the first qubit may be determined based on the first quantum state of the first qubit. A second set of expectation values for the second qubit may be determined at the quantum computing system. Determining the second set of expectation values for the second qubit may be determined based on the second quantum state of the second qubit. A value for at least a first parameter (e.g., a controlled phase, a swap angle, or a Z phase) of a set of parameters of the multi-qubit logic gate is determined at the quantum computing system. Determining the value for the first parameter may be based on the first set of expectation values for the first qubit and the second set of expectation values for the second qubit.

Other aspects of the present disclosure are directed to various systems, methods, apparatuses, non-transitory computer-readable media, computer-readable instructions, and computing devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which:

FIG. 5 depicts a flow diagram of an example method for characterizing a multi-qubit logic gate that is enabled to operate on a pair of qubits including a first qubit and a second qubit, according to example embodiments of the present disclosure.

DETAILED DESCRIPTION

Figure 1:
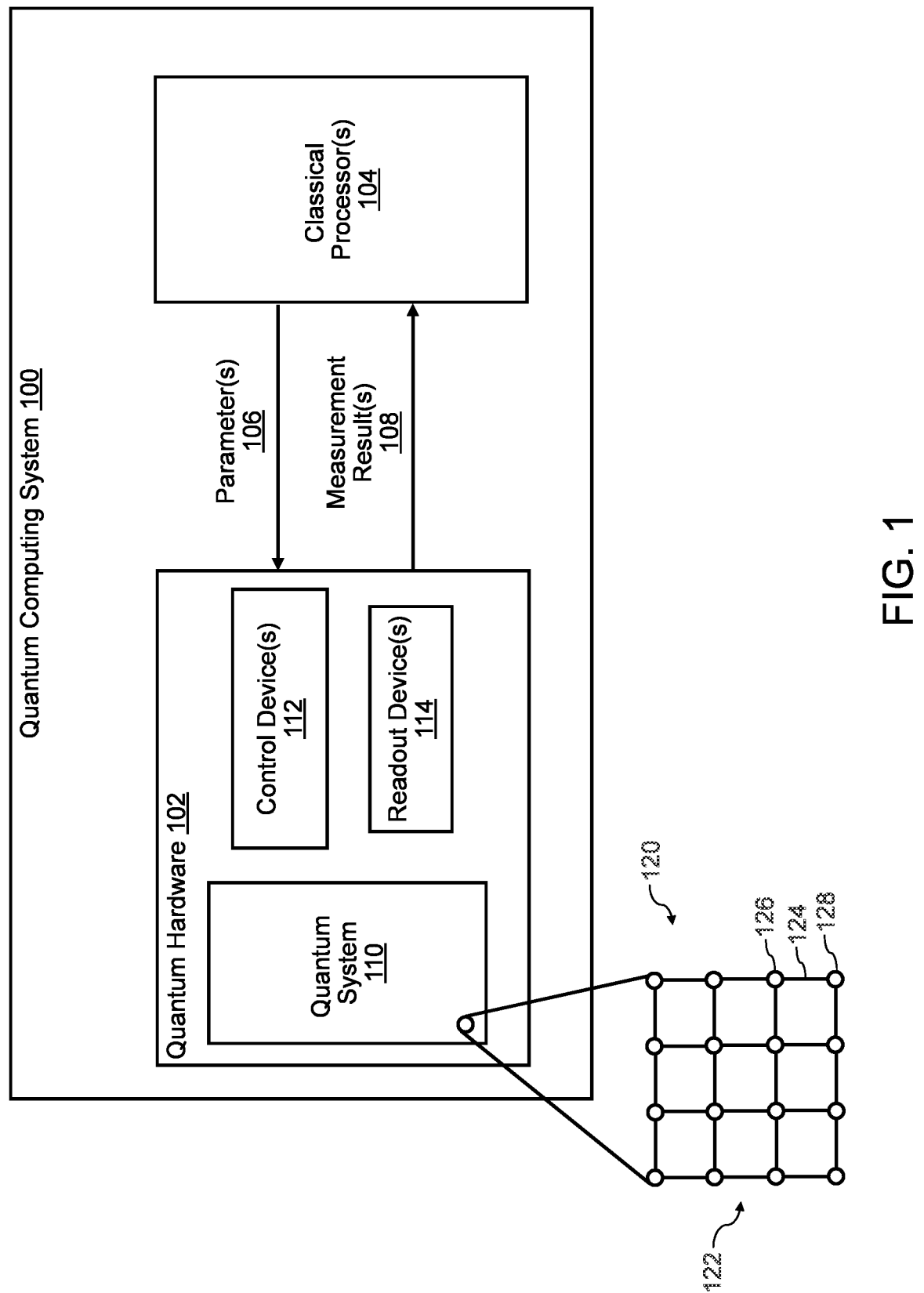
FIG. 1 depicts an example quantum computing system according to example embodiments of the present disclosure.

Example aspects of the present disclosure are directed to enhanced systems and methods for characterizing (e.g., calibrating) multi-qubit quantum logic gates (e.g., two-qubit quantum gates) in a quantum computing system. Quantum gates can be the building blocks of quantum circuits implemented by quantum computing systems for quantum computation and quantum information processing. Operation of a quantum computer can require characterization (or calibration) of experimentally realizable quantum logic gates. Characterization (or calibration) of a quantum logic gate may include determining values for a set of parameters (e.g., a set of gate parameters) that characterize the quantum logic gate. The various embodiments enable the determination of values for the set of gate parameters that are more accurate, more precise, more efficient, and less prone to noise and error than conventional methods of calibrating (quantum) logic gates.

Robust and efficient quantum gate characterization provides information about the actualized quantum gates, which can then be used for the subsequent quantum control calibration in a quantum computing system. Quantum control calibration can include, for instance, calibration of control pulses to implement the quantum gates on a quantum system having a plurality of qubits. Quantum gate characterization and calibration are useful for achieving high-fidelity quantum computation and large-scale deployment.

Composite gates that are characterizable via the various embodiments may be generalized Fermionic Simulation (fSim) gates that operate on a pair of qubits (e.g., a first qubit and a second qubit). As used throughout, an fSim gate may be an example of a multi-qubit (quantum) logic gate. A generalized fSim gate may implement at least two quantum logic operations on an input two-qubit pair: (a) a swap operation that "swaps" the qubit pair through an arbitrary swap angle ($\theta$) and (b) a controlled phase operation that generates an arbitrary phase between the qubit pair (e.g., a controlled phase ($\varphi$)). The set of two quantum operations: {swap, controlled phase} may form a functional complete (or almost functionally complete) set of quantum logic operations on the qubit pair. As such, the fSim gate may be characterized by determining values for a set of gate parameters that includes at least a swap angle ($\theta$) parameter and a controlled phase ($\varphi$) parameter. In some embodiments, a value for another gate parameter, a common Z-phase for the pair of qubits, may also be determined. Determining values for the parameters of the set of gate parameters may include determining values of each parameter as a function of the operational frequency of the gate.

Conventional methods for calibrating fSim gates (e.g., determining values for at least one of the Z-phase parameter, the swap angle parameter, and a control phase for the gate) are prone to noise and other instabilities due to fluctuations single-qubit Z phase gates that are conventionally employed to determine values for the set of (gate) parameters. More particularly, such fluctuations in the Z phase gates manifest in noise when conventionally determining (or measuring) the swap angle parameter. Furthermore, such conventional methods may not be generalizable to determine the controlled phase and may be employed to only calibrate a special instance of an fSim gate (e.g., a controlled Z gate).

The embodiments address these, and other shortcomings associated with conventional gate calibration methods by employing various enhanced quantum measurement circuits to carry out a set of enhanced quantum measurements. These enhanced measurements enable the determination of values for parameters for a generalized fSim gate. That is, the enhanced quantum circuits and enhanced quantum measurements enable the determination of values for at least a controlled phase and a swap angle. More particularly, via the circuits and measurements, multiple noise parameters become decoupled, and the determination of the gate parameters do not depend on the noise parameters. Via the decoupling of the noise parameters, the determination of the values of the gate parameters is insensitive to noise within the quantum measurements. The decoupling of the noise parameters may be accomplished via the repetitive application of $\pi$ pulses on each of the qubits, where consecutive $\pi$ pulses are interleaved with repetitive applications of the fSim gate. The $\pi$ pulses may be implemented via Pauli gates (e.g., X gates and/or Y gates). In some embodiments, the $\pi$ pulses provided to each of the first qubit and the second qubit may be in-phase $\pi$ pulses (e.g., implemented by a pair of parallel X gates). In other embodiments, the $\pi$ pulses provided to each of the first qubit and the second qubit may be out-of-phase $\pi$ pulses (e.g., implemented by a parallel pair of Pauli gates including an X gate operating on the first qubit and a Y gate operating on the second qubit). The measurements enable the determination of various expectation values (e.g., as encoded in operator matrix elements). Such noise-insensitive expectation values may be employed to determine values for the set of gate parameters. The quantum circuits and quantum measurements, as well as the determination of the expectation values and parameter values are discussed below.

Aspects of the present disclosure provide a number of technical effects and benefits. For instance, conventional methods may be constrained to calibrating only a controlled Z gate, which is a special instance of an fSim gate. In contrast, the various embodiments are enabled to determine values for a full set of gate parameters that fully characterize a fully generalized fSim gate. Being constrained to a controlled Z-gate, conventional methods may be equipped to determine values for only a single gate parameter (e.g., the swap angle). That is, these conventional embodiments may not be enabled to determine values for the controlled phase of a generalizable fSim gate. In contrast, the embodiments are enabled to determine values for at least both the swap angle and the controlled phase of a generalized fSim gate. Furthermore, the various embodiments require less circuits (or equivalently shallower circuit depths) for the same precision in the determination of the swap angle, as to those conventional methods that provide for a similar precision. Additionally, the conventional methods may require the use of a physical Z gate, to determine the value of the swap angle. The use of a physical Z gate requires additional calibration and introduces noised for an equivalent circuit depth. The various embodiments do not require the use of a physical Z gate to determine values for the parameters, and thus the various embodiments are associated with lesser amounts of noise and/or calibration. Rather than a Z gate, the various embodiments may employ one or more X gates and/or one or more Y gates.

FIG. 1 depicts an example quantum computing system 100. The system 100 is an example of a system of one or more classical computers and/or quantum computing devices in one or more locations, in which the systems, components, and techniques described below can be implemented. Those of ordinary skill in the art, using the disclosures provided herein, will understand that other quantum computing devices or systems can be used without deviating from the scope of the present disclosure.

The system 100 includes quantum hardware 102 in data communication with one or more classical processors 104. The classical processors 104 can be configured to execute computer-readable instructions stored in one or more memory devices to perform operations, such as any of the operations described herein. The quantum hardware 102 includes components for performing quantum computation. For example, the quantum hardware 102 includes a quantum system 110, control device(s) 112, and readout device(s) 114 (e.g., readout resonator(s)). The quantum system 110 can include one or more multi-level quantum subsystems, such as a register of qubits (e.g., qubits 120). In some implementations, the multi-level quantum subsystems can include superconducting qubits, such as flux qubits, charge qubits, transmon qubits, gmon qubits, spin-based qubits, and the like.

The type of multi-level quantum subsystems that the system 100 utilizes may vary. For example, in some cases it may be convenient to include one or more readout device(s) 114 attached to one or more superconducting qubits, e.g., transmon, flux, gmon, xmon, or other qubits. In other cases, ion traps, photonic devices or superconducting cavities (e.g., with which states may be prepared without requiring qubits) may be used. Further examples of realizations of multi-level quantum subsystems include fluxmon qubits, silicon quantum dots or phosphorus impurity qubits.

Quantum circuits may be constructed and applied to the register of qubits included in the quantum system 110 via multiple control lines that are coupled to one or more control devices 112. Example control devices 112 that operate on the register of qubits can be used to implement quantum gates or quantum circuits having a plurality of quantum gates, e.g., Pauli gates, Hadamard gates, controlled-NOT (CNOT) gates, controlled-phase gates, T gates, multi-qubit quantum gates, coupler quantum gates, etc. The one or more control devices 112 may be configured to operate on the quantum system 110 through one or more respective control parameters (e.g., one or more physical control parameters). For example, in some implementations, the multi-level quantum subsystems may be superconducting qubits and the control devices 112 may be configured to provide control pulses to control lines to generate magnetic fields to adjust the frequency of the qubits.

The quantum hardware 102 may further include readout devices 114 (e.g., readout resonators). Measurement results 108 obtained via measurement devices may be provided to the classical processors 104 for processing and analyzing. In some implementations, the quantum hardware 102 may include a quantum circuit and the control device(s) 112 and readout devices(s) 114 may implement one or more quantum logic gates that operate on the quantum system 102 through physical control parameters (e.g., microwave pulses) that are sent through wires included in the quantum hardware 102. Further examples of control devices include arbitrary waveform generators, wherein a DAC (digital to analog converter) creates the signal.

The readout device(s) 114 may be configured to perform quantum measurements on the quantum system 110 and send measurement results 108 to the classical processors 104. In addition, the quantum hardware 102 may be configured to receive data specifying physical control qubit parameter values 106 from the classical processors 104. The quantum hardware 102 may use the received physical control qubit parameter values 106 to update the action of the control device(s) 112 and readout devices(s) 114 on the quantum system 110. For example, the quantum hardware 102 may receive data specifying new values representing voltage strengths of one or more DACs included in the control devices 112 and may update the action of the DACs on the quantum system 110 accordingly. The classical processors 104 may be configured to initialize the quantum system 110 in an initial quantum state, e.g., by sending data to the quantum hardware 102 specifying an initial set of parameters 106.

In some implementations, the readout device(s) 114 can take advantage of a difference in the impedance for the $|0\rangle$ and $|1\rangle$ states of an element of the quantum system, such as a qubit, to measure the state of the element (e.g., the qubit). For example, the resonance frequency of a readout resonator can take on different values when a qubit is in the state $|0\rangle$ or the state $|1\rangle$, due to the nonlinearity of the qubit. Therefore, a microwave pulse reflected from the readout device 114 carries an amplitude and phase shift that depend on the qubit state. In some implementations, a Purcell filter can be used in conjunction with the readout device(s) 114 to impede microwave propagation at the qubit frequency.

In some embodiments, the quantum system 110 can include a plurality of qubits 120 arranged, for instance, in a two-dimensional grid 122. For clarity, the two-dimensional grid 122 depicted in FIG. 1 includes 4×4 qubits, however in some implementations the system 110 may include a smaller or a larger number of qubits. In some embodiments, the multiple qubits 120 can interact with each other through multiple qubit couplers, e.g., qubit coupler 124. The qubit couplers can define nearest neighbor interactions between the multiple qubits 120. In some implementations, the strengths of the multiple qubit couplers are tunable parameters. In some cases, the multiple qubit couplers included in the quantum computing system 100 may be couplers with a fixed coupling strength.

In some implementations, the multiple qubits 120 may include data qubits, such as qubit 126 and measurement qubits, such as qubit 128. A data qubit is a qubit that participates in a computation being performed by the system 100. A measurement qubit is a qubit that may be used to determine an outcome of a computation performed by the data qubit. That is, during a computation an unknown state of the data qubit is transferred to the measurement qubit using a suitable physical operation and measured via a suitable measurement operation performed on the measurement qubit.

In some implementations, each qubit in the multiple qubits 120 can be operated using respective operating frequencies, such as an idling frequency and/or an interaction frequency and/or readout frequency and/or reset frequency. The operating frequencies can vary from qubit to qubit. For instance, each qubit may idle at a different operating frequency. The operating frequencies for the qubits 120 can be chosen before a computation is performed.

FIG. 1 depicts one example quantum computing system that can be used to implement the methods and operations according to example aspects of the present disclosure. Other quantum computing systems can be used without deviating from the scope of the present disclosure.

Figure 2A:
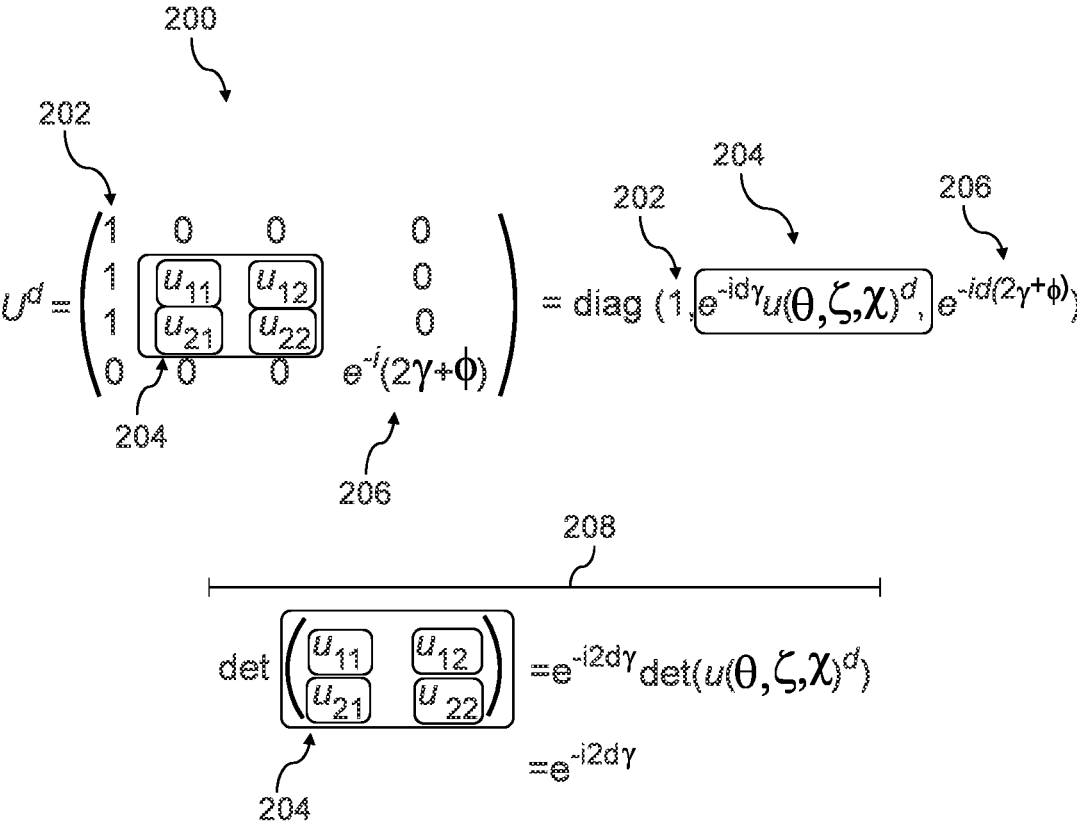
FIG. 2A depicts operations for a generalized multi-qubit logic gate that is characterizable via the various embodiments of the present disclosure.

FIG. 2A depicts operations for a generalized multi-qubit logic gate (e.g., an fSim gate) that is characterizable via the various embodiments of the present disclosure. More particularly, unitary matrix 200 encodes the unitary operations for an fSim gate (e.g., an fSim gate operating on a two-qubit system) for the arbitrary swap angle ($\theta$) and the arbitrary controlled phase ($\varphi$). In addition to being a function of a swap angle parameter and a controlled phase parameter, the operations of the fSim gate are also a function of a Z phase parameter ($\gamma$). The Z phase parameter is a phase angle that is common to both qubits in the qubit pair. Note that unitary matrix 200 is a block diagonal matrix that includes diagonal component: the scalar identity component 202, the 2×2 sub matrix 204, and the scalar phase component 206. The sub-matrix 202 includes the 4 matrix complex elements: $\{u_{11}, u_{12}, u_{21}, u_{22}\}$. The phase component 206 is a function of both the common Z phase and the controlled phase. Expression 208 indicates that the common Z phase may be calculated from the determinant of the sub-matrix 204.

Figure 2B:
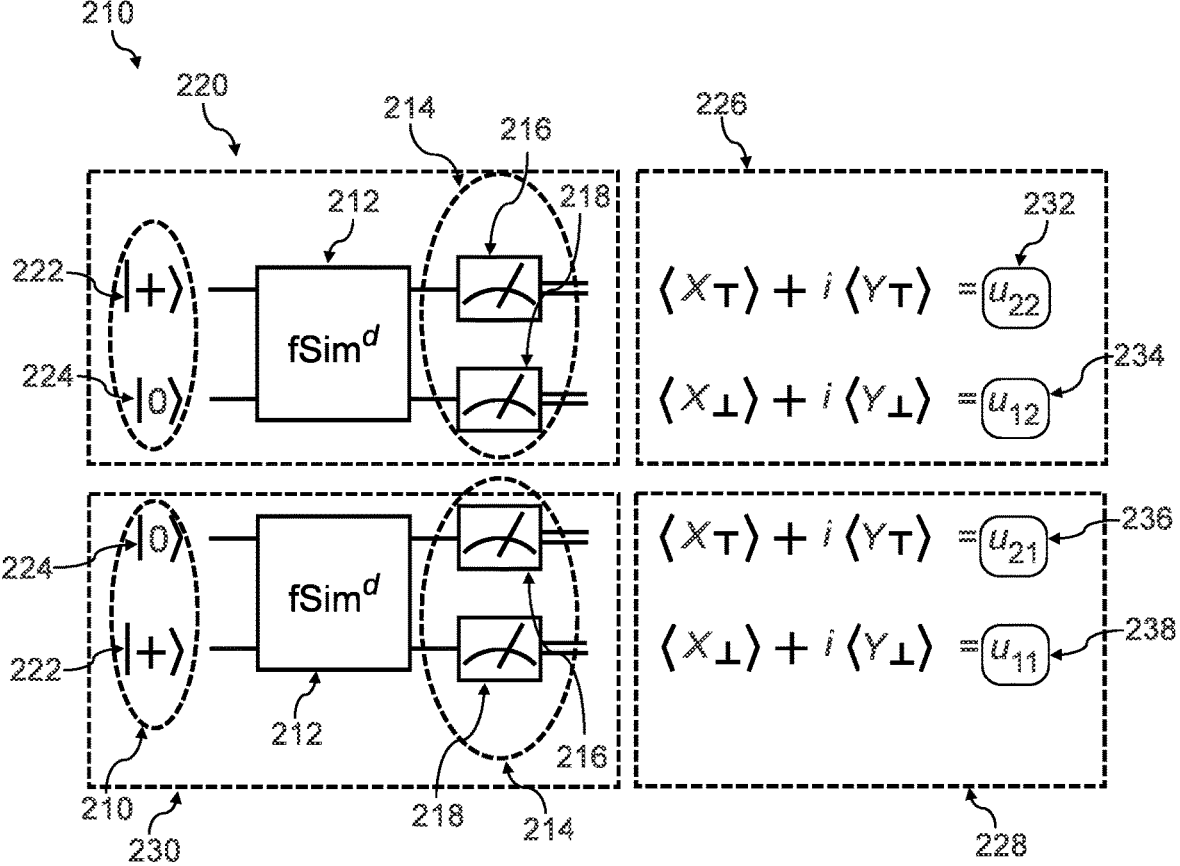
FIG. 2B depicts quantum state measurements that enable the determination of the matrix elements of the sub-matrix of FIG. 2A, according to various embodiments.

FIG. 2B depicts quantum state measurements that enable the determination of the matrix elements of the sub-matrix 204 of FIG. 2A, according to various embodiments. As noted above, expression 208 of FIG. 2A indicates that the common Z phase of the two qubits operated on by an fSim gate (e.g., fSim gate 212 of FIG. 2B) may be calculated from the determinant of the sub-matrix 204 of FIG. 2A. More particularly, FIG. 2B shows two separate experimental set-ups: a first experimental setup 220 and a second experimental setup 230. Both the first experimental setup 220 and the second experimental setup employ a qubit pair 210, an fSim gate 212, and a pair of quantum measurement devices 214. In the following discussion, the first qubit of the qubit pair 210 is referred to as the "upper" qubit and the second qubit of the qubit pair 210 is referred to as the "lower" qubit (e.g., upper and lower being relative terms with respect to the vertical axis of the plane of FIG. 2A). A first quantum measurement device 216 of the pair of quantum measure-ment devices 214 is enabled to measure (or observe) a quantum state of the first (or upper) qubit of the qubit pair 210. A second quantum measurement device 218 of the pair of quantum measurement devices 214 is enabled to measure (or observe) a quantum state of the second (or lower) qubit of the qubit pair 210. Each of the first quantum measurement device 216 and the second quantum measurement device 218 are enabled to selectively measure (or observe) the quantum state of their corresponding qubit with respect to either of the two "X" observable states (or eigenstates) or the two "Y" observable states (or eigenstates), where X and Y are the basis states corresponding to the respective Pauli matrices.

In the first experimental setup 220, the upper qubit is prepared in the first Hadamard state 222

$$(e.g., |+\rangle = \frac{1}{\sqrt{2}}(|0\rangle + |1\rangle))$$

in the $\{|0\rangle, |1\rangle\}$ basis) and the lower qubit is prepared in the vacuum state 224 (e.g., $|0\rangle$). In the second experimental setup 230, the upper qubit is prepared in the vacuum state 224 (e.g., $|0\rangle$) and the lower qubit is prepared in the first Hadamard state 222

$$(e.g., |+\rangle = \frac{1}{\sqrt{2}}(|0\rangle + |1\rangle)).$$

Each of the first experimental setup 220 and the second experimental setup 230 can be configured to run two sepa-rate measurements: a first measurement where each of the first quantum measurement device 216 and the second quantum measurement device 218 are operated to measure the X observable state of their corresponding qubits and a second measurement where each of the first quantum mea-surement device 216 and the second quantum measurement device 218 are operated to measure the Y observable state of their corresponding qubits. Thus, a total of eight measure-ments are shown via first experimental setup 220 and the second experimental setup.

Each of the eight measurements may be repeatably carried out enough times to determine to the four expectation values: $\{\langle X_\perp\rangle, \langle X_T\rangle, \langle Y_\perp\rangle, \langle Y_T\rangle\}$ with sufficient sta-tistical significance, for each of the first experimental setup 220 and the second experimental setup 230, where the subscripts $\{_\perp, T\}$ refer to the lower and upper qubits respec-tively. The first box 226 includes a first expression 232 and a second expression 234. The first expression 232 demon-strates how the complex matrix element $u_{22}$ of sub-matrix 204 of FIG. 2A may be calculated from the measured expectation values $\{\langle X_T\rangle, \langle Y_T\rangle\}$ as measured via the first experimental setup 220. The second expression 234 dem-onstrates how the complex matrix element $u_{12}$ of sub-matrix 204 of FIG. 2A may be calculated from the measured expectation values $\{\langle X_\perp\rangle, \langle Y_\perp\rangle\}$ as measured via the first experimental setup 220. The second box 228 includes a third expression 236 and a fourth expression 238. The third expression 236 demonstrates how the complex matrix ele-ment $u_{21}$ of sub-matrix 204 of FIG. 2A may be calculated from the measured expectation values $\{\langle X_T\rangle, \langle Y_T\rangle\}$ as measured via the second experimental setup 230. The fourth expression 238 demonstrates how the complex matrix ele-ment $u_{11}$ of sub-matrix 204 of FIG. 2A may be calculated from the measured expectation values $\{\langle X_\perp\rangle, \langle Y_\perp\rangle\}$ as measured via the second experimental setup 230. Expression 208 indicates how the common Z phase may be estimated from the measured values of the matrix elements of the sub matrix 204. The first experimental setup 220 and the second experimental setup 230 may be comprised of a quantum logic circuit.

Figures 3A, 3B:
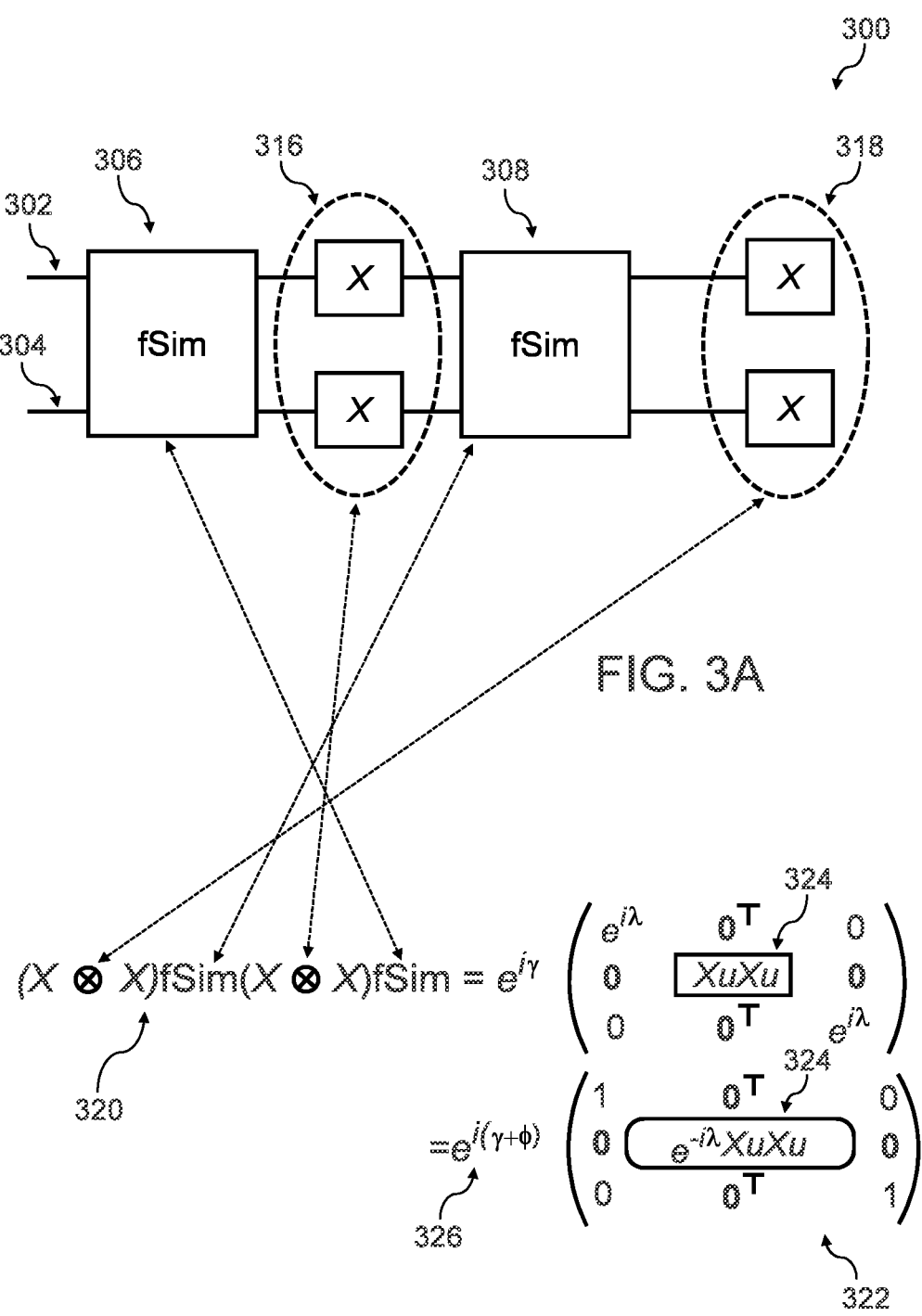
FIG. 3A depicts quantum state measurements that enable the determination of the controlled phase parameter of a multi-qubit logic gate (e.g., an fSim gate) via dynamical decoupling, according to various embodiments.
FIG. 3B shows a mathematical representation of the operations of the multi-qubit quantum logic circuit of FIG. 3A, according to various embodiments.

FIG. 3A depicts quantum state measurements that enable the determination of the controlled phase parameter of a multi-qubit logic gate (e.g., an fSim gate) via dynamical decoupling, according to various embodiments. FIG. 3A includes an experimental setup that includes a multi-qubit quantum logic circuit 300. The multi-qubit quantum logic circuit 300 includes a first qubit line 302 and a second qubit line 304. The multi-qubit quantum logic circuit 300 further includes at least two fSim gates: a first fSim gate 306 and a second fSim gate 308 and at least two pairs of corresponding X gates: a first pair of X gates 316 and a second pair of X gates 318, where an X gate may be quantum NOT gate (e.g., as represented by the Pauli matrix $$\sigma_x = \begin{pmatrix} 0 & 1 \\ 1 & 0 \end{pmatrix}$$

in the $\{|0\rangle, |1\rangle\}$ basis). A X gate in each pair of X gates may correspond to a qubit line of the pair of qubit lines (e.g., the first qubit line 302 and the second qubit line 304). An X gate (or NOT gate) may have the effect of rotating the quantum state of the corresponding qubit $\pi$ radians around the x axis of a Bloch sphere representation of the qubit. Providing such a rotation to the qubit may be referred to as providing a "$\pi$ pulse" to the qubit. Note that in multi-qubit quantum logic circuit 300, a $\pi$ pulse is provided to each qubit after the operations of the fSim gate.

Note that the first fSim gate 306 and the second fSim gate 308 need not be separate physical gates. Rather, the first fSim gate 306 and the second fSim gate 308 may be the same physical fSim gate. Likewise, the first pair of X gates 316 and the second pair of X gates 318 need not be separate pairs of X gates. Rather, the first pair of X gates 316 and the second pair of X gates 318 may be same physical pair of X gates. The multi-qubit quantum logic gate 300 may "loop" back on itself in a feedback orientation. The multi-qubit quantum logic circuit 300 with the same physical gates may be programmed to iteratively feedback on itself.

In other embodiments of the multi-qubit quantum logic circuit 300 (e.g., multi-qubit quantum logic circuit 340 of FIG. 3C), additional (and alternating) copies of fSim gates and X gates may be positioned on the pair of qubit lines. In some embodiments, a pair of X gates may be positioned to the right of each fSim gate, such that a π pulse is provided to each qubit after being operated on by the corresponding fSim gate. Although not shown explicitly in FIG. 3A, a pair of quantum measurement devices (e.g., the pair of quantum measurement devices 214 of FIG. 2B) is positioned on the pair of qubit lines of multi-qubit quantum logic circuit 300 such that a quantum state of each qubit may be measured after the qubit is processed by the alternating series of fSim gates and X gates.

Figure 3C:
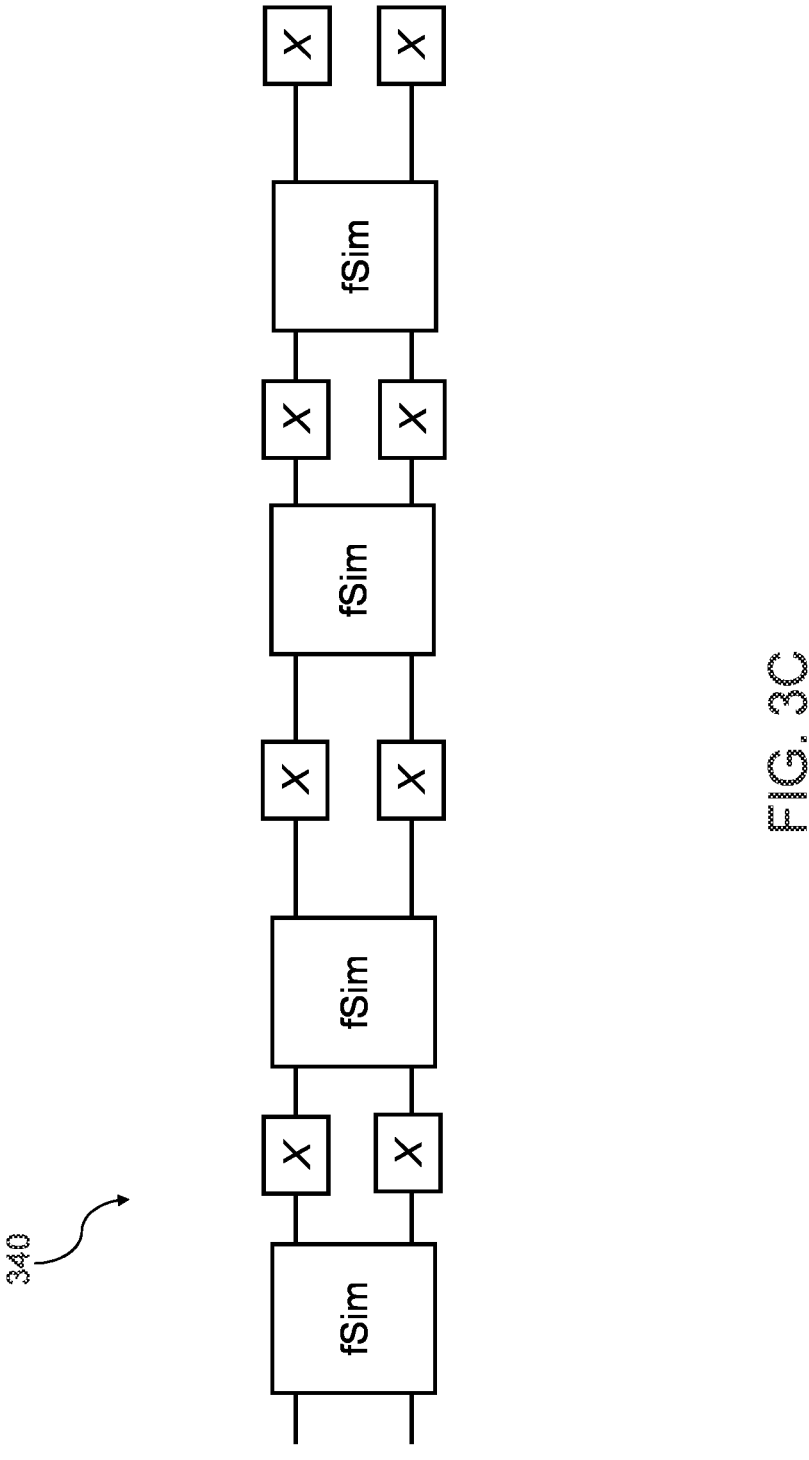
FIG. 3C shows a multi-qubit quantum logic circuit for determining the controlled phase parameter of a fSim gate, of depth four, according to various embodiments.

The π pulse provided to each qubit after being operated on by the fSim gate serves to dynamically decouple noise parameters for the determination of the controlled phase parameter ($\varphi$). Each a pulse serves to further decouple the noise parameters. Thus, the greater the number of alternating fSim and pairs of X gates, the greater the reduction in the noise of the measurement of the controlled phase parameter. The "depth" of the quantum logic circuit may be increased to provide for greater levels of noise suppression in the determination of the controlled phase parameter, where the depth refers to the number of alternating pairs of fSim gates and pairs of X gates. The depth of the multi-qubit quantum logic circuit 300 is 2. Briefly turning attention to FIG. 3C, FIG. 3C shows a multi-qubit quantum logic circuit 340 for determining the controlled phase parameter of a fSim gate, of depth four, according to various embodiments. Multi-qubit quantum logic circuit 340 is similar to the multi-qubit quantum logic circuit 300 of FIG. 3A, except multi-qubit quantum logic circuit 340 has depth of 4, whereas the multi-qubit quantum logic circuit 300 has a depth of two. Multi-qubit quantum logic circuit 340 may provide for greater noise suppression when determining the controlled phase parameter, as compared to the multi-qubit quantum logic circuit 300. The depth parameter may indicate the number of times that a quantum logic circuit is programmed to feedback onto itself to iteratively apply the alternating sequences of fSim and X gates. For example, with a depth of 4, a quantum logic circuit may programmatically feedback onto it three times.

FIG. 3B shows a mathematical representation of the operations of the multi-qubit quantum logic circuit 300 of FIG. 3A, according to various embodiments. Expression 320 shows the matrix operations of the multi-qubit quantum logic circuit 300 operating on a qubit pair. The arrowed hashed lines between FIGS. 3A-3B indicate the correspondence between the quantum circuit elements of the multi-qubit quantum logic circuit 300 and the various factors in expression 320. Note that each factor of expression 320 is a 4×4 matrix. The product of the 4 factors of expression 320 give rise to the unitary (and block diagonal) matrix 322. Similar to matrix 200 of FIG. 2A, the "center" element of matrix 322 is a 2×2 sub-matrix 324. The elements of the sub-matrix 324 may be determined similar to the measurements and expressions of FIG. 2B. Accordingly, the four elements of the sub-matrix 323 may be experimentally measured via repetitive measurements that provide sufficient statistical significance. The expressions 320 may be updated to accommodate quantum logic circuits of greater depth than two (e.g., multi-qubit quantum logic circuit 340 of FIG. 3C), by inserting larger numbers of factors in the expression 320.

Note that matrix 322 (and the sub-matrix 324) includes a common phase factor 326 that is dependent on both the common Z-phase parameter ($\gamma$) and the controlled phase parameter ($\varphi$). Accordingly, upon determination of the controlled phase parameter (as discussed in conjunction with FIGS. 2A-2B), the controlled phase parameter may be determined via the common phase factor 326, which itself is determined by measuring the matrix elements of sub-matrix 324.

Figure 4:
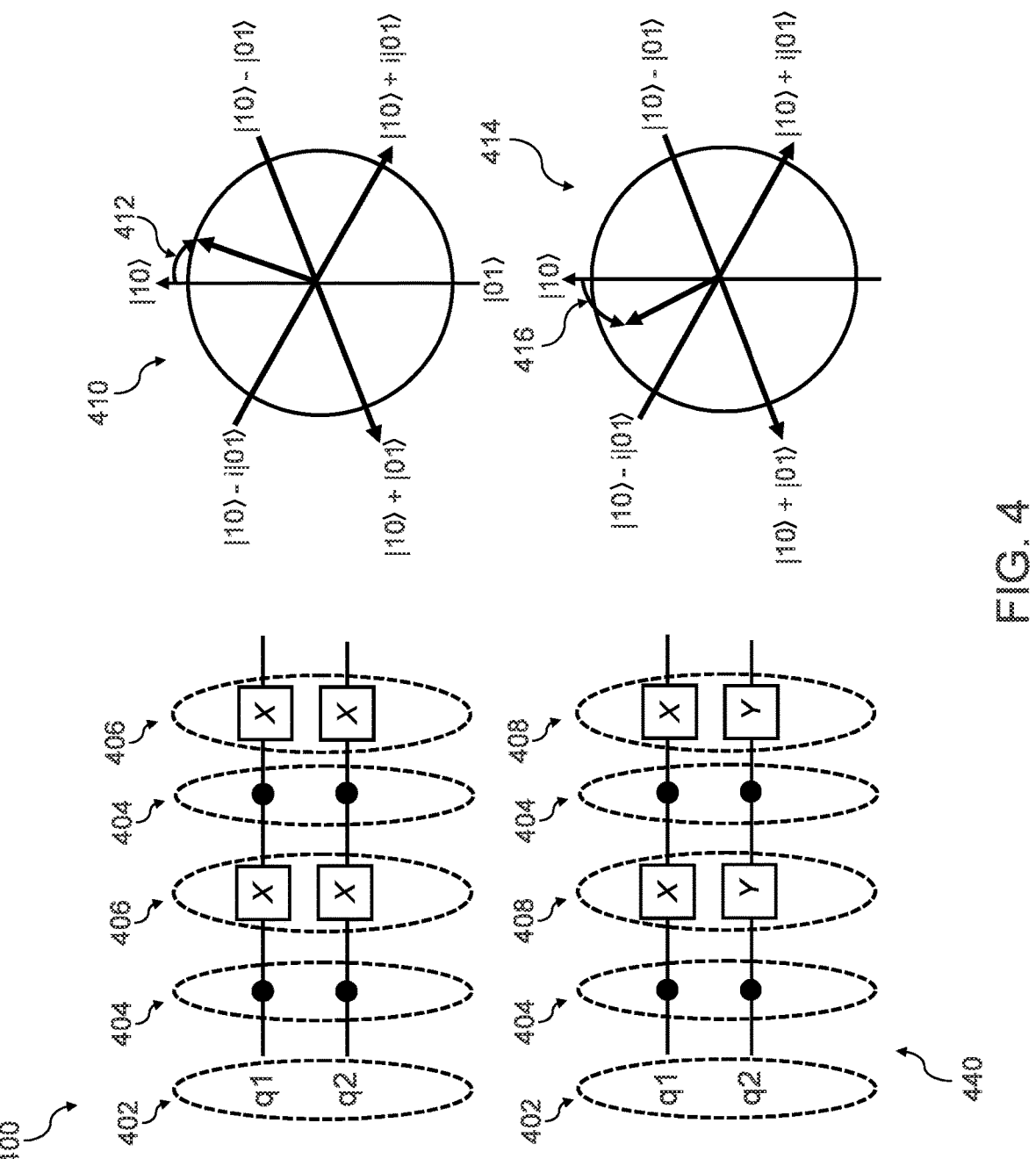
FIG. 4 depicts quantum state measurements that enable the determination of the swap angle parameter of a multi-qubit logic gate (e.g., an fSim gate) via dynamical decoupling, according to various embodiments.

FIG. 4 depicts quantum state measurements that enable the determination of the swap angle parameter of an fSim gate via dynamical decoupling, according to various embodiments. FIG. 4 shows a first experimental setup and a second experimental setup employed to determine a swap angle for an fSim gate. The first experimental setup includes a first multi-qubit quantum logic circuit 400 and the second experimental setup includes a second multi-qubit quantum logic circuit 440. The first multi-qubit quantum logic circuit 400 is enabled to operate on a qubit pair 402. The pair of qubits 402 includes a first qubit (e.g., q1) and a second qubit (e.g., q2). The first multi-qubit logic circuit 400 includes a multi-qubit logic gate (e.g., fSim gate 404) and a first pair of single-qubit logic gates 406. The multi-qubit logic gate 404 is enabled to operate on each of the qubits of the pair of qubits 402. As shown in the schematic of the first multi-qubit quantum logic circuit 400, the multi-qubit logic gate is operated as a CZ (e.g., a controlled Z gate).

The first pair of single-qubit logic gates 406 includes a first single-qubit logic gate (e.g., a first X gate) that is enabled to operate on the first qubit of the qubit pair 402 and a second single-qubit logic gate (e.g., a second X gate) that is enabled to operate on the second qubit of the qubit pair 402. The depth of the multi-qubit quantum circuit is two. Thus, two instantiations of the multi-qubit logic gate 404 and two instantiations of the first pair of single-qubit logic gates 402 are shown in the schematic representation of the first multi-qubit quantum logic circuit 400.

In some embodiments, the first qubit is initially prepared in the first excitation state (e.g., $|1\rangle$ ) and the second qubit is initially prepared in the vacuum state (e.g., $|0\rangle$ ), such that the initial state of the pair of qubits 402 is represented by the state vector $|10\rangle$ Similar to the discussion in FIGS. 3A-3C, the effect of the first pair of single-qubit logic gates 406 is to provide π pulses to the qubits of the qubit pair 402. Because both single-qubit logic gates in the first pair of single-qubit logic gates 406 are X gates, the π pulses are in phase. Also shown in FIG. 4 is a first Bloch sphere representation 410 of the qubit pair 402, where the initial preparation of the qubit pair 402 lies along the Z-axis of the first Bloch sphere representation 410. The repeated applications of the CZ gate (e.g., the multi-qubit logic gate 404) and the pair of single-qubit logic gates 406 conserve the number of excited states of the qubit pair 402. Accordingly, because the qubit pair 402 is initially prepared in the $|10\rangle$ state, the first Bloch sphere representation 410 covers the entirety of the 2D subspace available to the qubit pair 402.

The first pair of single-qubit logic gates 406 tend to dynamically decouple the noise parameters of the measurement of the swap angle. As shown by arrow 412, the operations of the dynamical decoupling of the first pair of single-qubit logic gates 406 tend to rotate the state vector $|10\rangle$ towards to $|10\rangle + |01\rangle$ axis of the first Bloch sphere representation 410. The dynamical decoupling of the noise parameters achieved via the operations of the dynamical decoupling of the first pair of single-qubit logic gates 406 tend to dampen out other rotations of the state vector. Note that the swap angle may be a complex value, via repeated measurements similar to those discussed in conjunction with FIG. 2B, the real value of the swap angle may be determined via a first multi-qubit quantum logic circuit 400.

Similar to the first multi-qubit quantum logic circuit 400, the second multi-qubit quantum logic circuit 440 is enabled to operate on the qubit pair 402. The second multi-qubit quantum logic circuit 440 may be similar to the first multi-qubit quantum logic circuit 400, except rather than the first pair of single-qubit logic gates 406, the second multi-qubit quantum logic circuit 440 includes a second pair of single-qubit logic gates 408. The second pair of single-qubit logic gates 408 includes a first single-qubit logic gate (e.g., a first X gate) that is enabled to operate on the first qubit of the qubit pair 402 and a second single-qubit logic gate (e.g., a first Y gate) that is enabled to operate on the second qubit of the qubit pair 402. The depth of the multi-qubit quantum circuit is two. Thus, two instantiations of the multi-qubit logic gate 404 and two instantiations of the second pair of single-qubit logic gates 402 are shown in the schematic representation of the second multi-qubit quantum logic circuit 440.

Similar to the discussion above, in some embodiments, the first qubit is initially prepared in the first excitation state (e.g., $|1\rangle$) and the second qubit is initially prepared in the vacuum state (e.g., $|0\rangle$), such that the initial state of the pair of qubits 402 is represented by the state vector $|10\rangle$ Similar to the discussion in FIGS. 3A-3C, the effect of the second pair of single-qubit logic gates 406 is to provide a pulses to the qubits of the qubit pair 402. Because the first single-qubit logic gate is an X gate and the second single-qubit gate is a Y gate in the second pair of single-qubit logic gates 408, the π pulses are out-of-phase. Also shown in FIG. 4 is a second Bloch sphere representation 414 of the qubit pair 402, where the initial preparation of the qubit pair 402 lies along the Z-axis of the second Bloch sphere representation 414. The repeated applications of the CZ gate (e.g., the multi-qubit logic gate 404) and the second pair of single-qubit logic gates 408 conserve the number of excited states of the qubit pair 402. Accordingly, because the qubit pair 402 is initially prepared in the $|10\rangle$ state, the second Bloch sphere representation 414 covers the entirety of the 2D subspace available to the qubit pair 402.

The second pair of single-qubit logic gates 408 tend to dynamically decouple the noise parameters of the measurement of the swap angle. As shown by arrow 416, the operations of the dynamical decoupling of the second pair of single-qubit logic gates 408 tend to rotate the state vector $|10\rangle$ towards to $|10\rangle + i|01\rangle$ axis of the second Bloch sphere representation 414. The dynamical decoupling of the noise parameters achieved via the operations of the dynamical decoupling of the second pair of single-qubit logic gates 408 tend to dampen out other rotations of the state vector. Note that the swap angle may be a complex value, via repeated measurements similar to those discussed in conjunction with FIG. 2B, the imaginary value of the swap angle may be determined via a first multi-qubit quantum logic circuit 400

FIG. 5 depicts operations performed in a particular order for purposes of illustration and discussion. Those of ordinary skill in the art, using the disclosures provided herein, will understand that operations of any of the methods described herein can be expanded, include steps not illustrated, omitted, rearranged, and/or modified in various ways without deviating from the scope of the present disclosure. Various portions or steps of method 500 of FIG. 5 may be implemented by a quantum computing system (e.g., quantum computing system 100 of FIG. 1).

FIG. 5 depicts a flow diagram of an example method 500 for characterizing a multi-qubit logic gate (e.g., an fSim gate) that is enabled to operate on a pair of qubits including a first qubit and a second qubit, according to example embodiments of the present disclosure. Method 500 begins at block 502, where a set of serial operations is performed on the pair of qubits. The set of serial operations may be performed by a multi-qubit quantum circuit included in a quantum computing system. The multi-qubit quantum circuit may include at least the multi-qubit logic gate, a first single-qubit logic gate enabled to operate on the first qubit, and a second single-qubit logic gate that is enabled to operate on the second qubit. The set of serial operations may include a first operation comprising the multi-qubit logic gate operating on the pair of qubits. The set of serial operations may additionally include a second operation comprising the first single-qubit logic gate operating on the first qubit in parallel to the second single-qubit logic gate operating on the second qubit.

At block 504, and after iteratively performing the set of serial operations on the pair of qubits, a first quantum state of the first qubit may be measured at the quantum computing system. At block 506, and after iteratively performing the set of serial operations on the pair of qubits, a second quantum state of the second qubit may be measured at the quantum computing system.

At block 508, a first set of expectation values for the first qubit may be determined at the quantum computing system. The determination of the first set of expectation values for the first qubit may be determined based on the first quantum state of the first qubit. At block 510, a second set of expectation values for the second qubit may be determined at the quantum computing system. The determination of the second set of expectation values for the second qubit may be determined based on the second quantum state of the second qubit. At block 512, a value for at least a first parameter of a set of parameters of the multi-qubit logic gate may be determined at the quantum computing system. Determining the value for the first parameter may be based on the first set of expectation values for the first qubit and the second set of expectation values for the second qubit.

In some embodiments, the multi-qubit logic gate is a Fermionic Simulation (fSim) gate and the first parameter corresponds to a controlled phase of the fSim gate. In other embodiments, the multi-qubit logic gate is a Fermionic Simulation (fSim) gate and the first parameter corresponds to a swap angle of the fSim gate.

The first parameter may correspond to a controlled phase of the multi-qubit logic gate. In such embodiments, the method may include prior to iteratively performing the set of serial operations on the pair of qubits, preparing, at the quantum computing system, an initial quantum state of the first qubit in a vacuum state. Prior to iteratively performing the set of serial operations on the pair of qubits, an initial quantum state of the second qubit may be prepared in a first Hadamard state at the quantum computing system.

The first parameter may correspond to a swap angle of the multi-qubit logic gate. In such embodiments, the method may further include prior to iteratively performing the set of serial operations on the pair of qubits, preparing, at the quantum computing system, an initial quantum state of the first qubit in a vacuum state. Prior to iteratively performing the set of serial operations on the pair of qubits, an initial quantum state of the second qubit may be prepared in a first excited state at the quantum computing device.

Each of the first single-qubit logic gate and the second single-qubit logic gate is a Pauli gate. The first parameter may correspond to a controlled phase of the multi-qubit logic gate, the first single-qubit logic gate is a first instantiation of a Pauli-X gate, and the second single-qubit logic gate is a second instantiation of the Pauli-X gate. In other embodiments, the first parameter corresponds to a swap angle of the multi-qubit logic gate, the first single-qubit logic gate is a first instantiation of a Pauli-X gate, and the second single-qubit logic gate is a first instantiation of the Pauli-Y gate.

The first quantum state of the first qubit may correspond to an eigenstate of an X-observable of the first qubit and the second quantum state of the second qubit corresponds to an eigenstate of an X-observable of the second qubit. In other embodiments, the first quantum state of the first qubit corresponds to an eigenstate of a X-observable of the first qubit and the second quantum state of the second qubit corresponds to an eigenstate of a Y-observable of the second qubit. The first parameter corresponds to a swap angle of the multi-qubit logic gate and the multi-qubit logic gate is operated as a controlled Z gate (CZ gate).

Implementations of the digital, classical, and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qudits) are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital or classical computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL, Quipper, Cirq, etc.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more tangible, non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for characterizing a multi-qubit logic gate that is enabled to operate on a pair of qubits including a first qubit and a second qubit, the method comprising:

iteratively performing a set of serial operations, by a multi-qubit quantum circuit included in a quantum computing system, on the pair of qubits, wherein the multi-qubit quantum circuit includes at least the multi-qubit logic gate, a first single-qubit logic gate that is a first Pauli gate and is enabled to operate on the first qubit, and a second single-qubit logic gate that is a second Pauli gate and is enabled to operate on the second qubit, and wherein the set of serial operations includes a first operation comprising the multi-qubit logic gate operating on the pair of qubits and a second operation comprising the first single-qubit logic gate operating on the first qubit in parallel to the second single-qubit logic gate operating on the second qubit;

after iteratively performing the set of serial operations on the pair of qubits, measuring, at the quantum computing system, a first quantum state of the first qubit;

after iteratively performing the set of serial operations on the pair of qubits, measuring, at the quantum computing system, a second quantum state of the second qubit;

determining, at the quantum computing system, a first set of expectation values for the first qubit based on the first quantum state of the first qubit;

determining, at the quantum computing system, a second set of expectation values for the second qubit based on the second quantum state of the second qubit; and determining, at the quantum computing system, a value for at least a first parameter of a set of parameters of the multi-qubit logic gate based on the first set of expectation values for the first qubit and the second set of expectation values for the second qubit.

2. The method of claim 1, wherein the multi-qubit logic gate is a Fermionic Simulation (fSim) gate and the first parameter corresponds to a controlled phase of the fSim gate.

3. The method of claim 1, wherein the multi-qubit logic gate is a Fermionic Simulation (fSim) gate and the first parameter corresponds to a swap angle of the fSim gate.

4. The method of claim 1, wherein the first parameter corresponds to a controlled phase of the multi-qubit logic gate and the method further comprises:

prior to iteratively performing the set of serial operations on the pair of qubits, preparing, at the quantum computing system, an initial quantum state of the first qubit in a vacuum state; and prior to iteratively performing the set of serial operations on the pair of qubits, preparing, at the quantum computing system, an initial quantum state of the second qubit in a first Hadamard state.

5. The method of claim 1, wherein the first parameter corresponds to a swap angle of the multi-qubit logic gate and the method further comprises:

prior to iteratively performing the set of serial operations on the pair of qubits, preparing, at the quantum computing system, an initial quantum state of the first qubit in a vacuum state; and prior to iteratively performing the set of serial operations on the pair of qubits, preparing, at the quantum computing system, an initial quantum state of the second qubit in a first excited state.

6. The method of claim 1, wherein the first parameter corresponds to a controlled phase of the multi-qubit logic gate, the first single-qubit logic gate is a first instantiation of a Pauli-X gate, and the second single-qubit logic gate is a second instantiation of the Pauli-X gate.

7. The method of claim 1, wherein the first parameter corresponds to a swap angle of the multi-qubit logic gate, the first single-qubit logic gate is a first instantiation of a Pauli-X gate, and the second single-qubit logic gate is a first instantiation of the Pauli-Y gate.

8. The method of claim 1, wherein the first quantum state of the first qubit corresponds to an eigenstate of an X-observable of the first qubit and the second quantum state of the second qubit corresponds to an eigenstate of an X-observable of the second qubit.

9. The method of claim 1, wherein the first quantum state of the first qubit corresponds to an eigenstate of a Y-observable of the first qubit and the second quantum state of the second qubit corresponds to an eigenstate of a Y-observable of the second qubit.

10. The method of claim 1, wherein the first quantum state of the first qubit corresponds to an eigenstate of an X-observable of the first qubit and the second quantum state of the second qubit corresponds to an eigenstate of an Y-observable of the second qubit.

11. The method of claim 1, wherein the first parameter corresponds to a swap angle of the multi-qubit logic gate and the multi-qubit logic gate is operated as a controlled Z gate (CZ gate).

12. A quantum computing system, comprising:

a pair of qubits that includes a first qubit and a second qubit;

a multi-qubit quantum circuit that includes a multi-qubit gate, a first single qubit logic gate that is a first Pauli gate, and a second single qubit logic gate that is a second Pauli gate, wherein the multi-qubit logic gate is enabled to operate on the pair of qubits, the first single-qubit logic gate is enabled to operate on the first qubit, and the second single-qubit logic gate is enabled to operate on the second qubit;

one or more processors;

one or more memory devices, the one or more memory devices storing computer-readable instructions that when executed by the one or more processors cause the one or more processors to perform operations for characterizing the multi-qubit logic gate, the operations comprising:

iteratively performing a set of serial operations, by the multi-qubit quantum circuit, on the pair of qubits, wherein the multi-qubit quantum circuit includes at least the multi-qubit logic gate, a first single-qubit logic gate enabled to operate on the first qubit, and a second single-qubit logic gate that is enabled to operate on the second qubit, and wherein the set of serial operations includes a first operation comprising the multi-qubit logic gate operating on the pair of qubits and a second operation comprising the first single-qubit logic gate operating on the first qubit in parallel to the second single-qubit logic gate operating on the second qubit;

after iteratively performing the set of serial operations on the pair of qubits, measuring a first quantum state of the first qubit;

after iteratively performing the set of serial operations on the pair of qubits, measuring a second quantum state of the second qubit;

determining a first set of expectation values for the first qubit based on the first quantum state of the first qubit;

determining a second set of expectation values for the second qubit based on the second quantum state of the second qubit; and determining a value for at least a first parameter of a set of parameters of the multi-qubit logic gate based on the first set of expectation values for the first qubit and the second set of expectation values for the second qubit.

13. The system of claim 12, wherein the multi-qubit logic gate is a Fermionic Simulation (fSim) gate and the first parameter corresponds to a controlled phase of the fSim gate.

14. The system of claim 12, wherein the multi-qubit logic gate is a Fermionic Simulation (fSim) gate and the first parameter corresponds to a swap angle of the fSim gate.

15. The system of claim 12, wherein the first parameter corresponds to a controlled phase of the multi-qubit logic gate and the method further comprises:

prior to iteratively performing the set of serial operations on the pair of qubits, preparing an initial quantum state of the first qubit in a vacuum state; and prior to iteratively performing the set of serial operations on the pair of qubits, preparing an initial quantum state of the second qubit in a first Hadamard state.

16. The system of claim 12, wherein the first parameter corresponds to a swap angle of the multi-qubit logic gate and the method further comprises:

prior to iteratively performing the set of serial operations on the pair of qubits, preparing an initial quantum state of the first qubit in a vacuum state; and prior to iteratively performing the set of serial operations on the pair of qubits, preparing an initial quantum state of the second qubit in a first excited state.

17. The system of claim 12, wherein the first parameter corresponds to a controlled phase of the multi-qubit logic gate, the first single-qubit logic gate is a first instantiation of a Pauli-X gate, and the second single-qubit logic gate is a second instantiation of the Pauli-X gate.

18. The system of claim 12, wherein the first parameter corresponds to a swap angle of the multi-qubit logic gate, the first single-qubit logic gate is a first instantiation of a Pauli-X gate, and the second single-qubit logic gate is a first instantiation of the Pauli-Y gate.

* * * * *